United States Patent [19]

Hong

[11] Patent Number: 5,635,415

[45] Date of Patent: Jun. 3, 1997

[54] METHOD OF MANUFACTURING BURIED BIT LINE FLASH EEPROM MEMORY CELL

[75] Inventor: Gary Hong, Hsin-chu, Taiwan

[73] Assignee: United Microelectronics Corporation, Hsin-Chu, Taiwan

[21] Appl. No.: 346,867

[22] Filed: Nov. 30, 1994

[51] Int. Cl.⁶ .............................................. H01L 21/8247
[52] U.S. Cl. .......................... 438/261; 438/265; 438/263
[58] Field of Search .................... 437/43, 52; 257/316

[56] References Cited

U.S. PATENT DOCUMENTS

| | | | |
|---|---|---|---|
| 5,210,046 | 5/1993 | Crotti | 437/43 |
| 5,210,047 | 5/1993 | Woo et al. | 437/43 |
| 5,262,846 | 11/1993 | Gill et al. | 257/314 |
| 5,279,982 | 1/1994 | Crotti | 437/48 |
| 5,381,028 | 1/1995 | Iwasa | 257/316 |

*Primary Examiner*—John Niebling
*Assistant Examiner*—Richard A. Booth
*Attorney, Agent, or Firm*—William H. Wright

[57] ABSTRACT

A MOSFET device and a method of fabricating an MOSFET device on a lightly doped semiconductor substrate are described. First, form buried bitlines in the substrate. Form conductive, complementary bitline structures formed of doped polycrystalline silicon, the structures having lower surfaces formed on the buried bitlines in electrical contact therewith, and the complementary bitline structures having top surfaces and sidewalls. Form a polysilicon oxide of the doped polycrystalline silicon from the complementary bitline structures over the top surfaces thereof. Oxidize to form tunneling oxide polysilicon oxide sidewall layers adjacent to the complementary bitline structures. Simultaneously, form a tunnel oxide layer over the substrate between the complementary bitline structures. Form floating gates over the tunnel oxide layer and between the sidewall layers. Form an interconductor dielectric layer over the device Finally, form an array of wordlines over the interconductor dielectric layer.

22 Claims, 8 Drawing Sheets

METHOD OF MANUFACTURING BURIED BIT LINE FLASH EEPROM MEMORY CELL

BACKGROUND OF THE INVENTION

1. Field of the Invention

This invention relates to semiconductor memories and more particularly to flash memories and the method of manufacture thereof.

2. Description of Related Art

Figure 2:
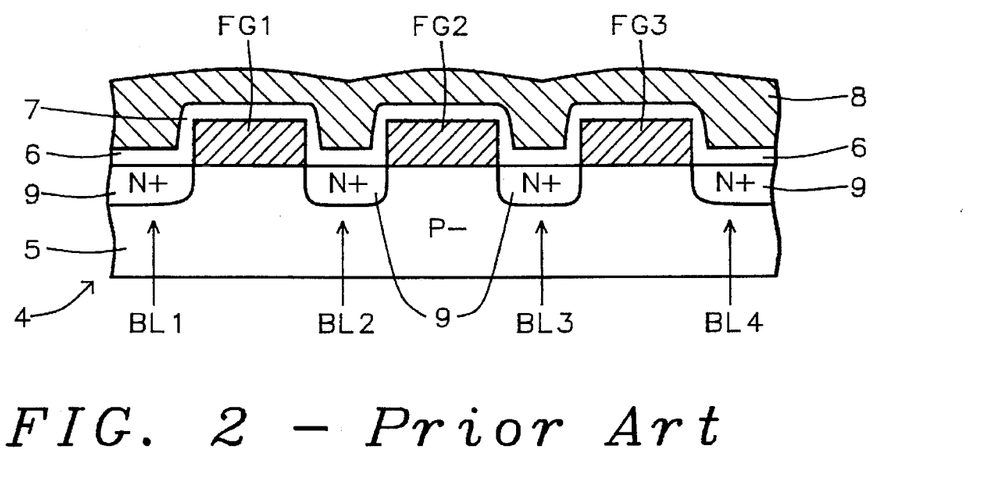
FIG. 2 shows a fragmentary sectional view of a prior art flash memory cell.

FIG. 2 shows a fragmentary sectional view of a prior art flash memory cell 4. Memory cell 4 includes a P– substrate 5 with an array of N+ buried bitline regions 9 therein forming buried bitlines BL1, BL2, BL3 and BL4 which extend back into the page. The buried bitlines 9 are formed in the surface of substrate 5. Above the substrate and the buried bitlines 9 is a thin tunnel oxide layer 6 having a thickness less than 100 Å. Polysilicon 1 floating gates FG1, FG2 and FG3 lie above the thin tunnel oxide layer 6. A dielectric layer 7 covers the floating gates FG1, FG2 and FG3. Above the dielectric layer 7 is formed a polysilicon 2 control gate (wordline) layer 8 extending transversely across the floating gates FG1, FG2 and FG3. The control gate (wordline) layer 8 overlies the floating gates FG1, FG2 and FG3 extending across the cell 4. The program and erase operations are performed through a thin tunnel oxide layer 6. A program operation is performed by pulling an electron from a buried N+ bitline 9 through the tunnel oxide layer 6 to a floating gate FG1. An erase operation is performed by pulling an electron from the floating gate FG1 through the tunnel oxide layer 6 into a buried bitline 9.

One problem with the device of FIG. 2 is the limited efficiency of the tunneling of programming and erase functions which are performed through a thin tunnel oxide layer 6 of less than 100 Å in thickness, which is not thick enough to provide for adequate reliability and production yield.

In addition, the bitline resistance is high because of the small cross sectional area of the bitlines in high density memory devices which necessarily limit the size of elements of the device.

U.S. Pat. No. 5,262,846 of Gill et al for "Contact-Free Floating-Gate Memory Array with Silicided Buried Bitlines and with Single-Step-Defined Floating Gates" shows a prior art process for forming a buried bitline EEPROM.

SUMMARY OF THE INVENTION

An object of this invention is to provide an improved efficiency of the tunneling for programming and erase functions.

Another object of this invention is to provide low bitline resistance.

In accordance with this invention, a MOSFET device is formed on a lightly doped semiconductor substrate comprising, buried bitlines in the substrate, complementary bitline structures above the buried bitlines in electrical contact therewith, the complementary bitline structures comprising doped polycrystalline silicon conductive structures above the buried bitlines, the complementary bitline structures having top surfaces and sidewalls, a polysilicon oxide of the doped polycrystalline silicon layer over the top surfaces of the complementary bitline structure, tunneling oxide, sidewall layers adjacent to the doped polycrystalline silicon conductive structures, a tunnel oxide layer over the substrate between the complementary bitline structures, floating gates over the tunnel oxide layer and between the sidewall layers, an interconductor dielectric layer over the floating gates and the polysilicon oxide, and an array of wordlines over the interconductor dielectric layer.

Preferably, the complementary bitline structures have a thickness between about 1000 Å and about 3000 Å. The floating gates have a thickness within a range from 1000 Å to 3000 Å. The sidewall layers comprise textured polysilicon oxide. The complementary bitline structures comprise doped polycrystalline silicon conductive structures above the buried bitlines, the complementary bitline structures having a thickness within a range between about 1000 Å and about 3000 Å; and the polysilicon oxide is textured. The complementary bitline structures comprise doped polycrystalline silicon conductors and the sidewall layers comprise polysilicon oxide having a thickness between about 300 Å and about 600 Å; and the polysilicon oxide film has a thickness between about 1000 Å and about 1500 Å on the top surfaces of the complementary bitline structures.

In accordance with another aspect of this invention, a MOSFET device on a lightly doped semiconductor substrate comprising, a first dielectric layer on the substrate, ion implanted dopant into buried bitline N+ source/drain regions in the substrate, a doped planarized polysilicon 1 bitline layer over the buried bitlines, a polysilicon oxide layer on the surface of the planarized polysilicon 1 layer, a polysilicon oxide sidewall layer on the sidewalls of the polysilicon 1 bitline layer and the exposed surface of the substrate, doped polysilicon 2 layer floating gate structures planarized down to the level of the polysilicon oxide over the surface of the polysilicon 1 layer, a blanket ONO layer over the device, and a third polysilicon control gate layer over the ONO layer. The second polysilicon layer has a thickness within a range from 1000 Å to 3000 Å. The polysilicon oxide is textured. The sidewalls of the polysilicon 1 comprises a polysilicon oxide sidewall layer having a thickness between about 300 Å and about 600 Å. The oxide on the surface of the polysilicon 1 provides a polysilicon oxide film having a thickness between about 1000 Å and about 1500 Å.

In accordance with still another aspect of this invention, a method of fabricating an MOSFET device on a lightly doped semiconductor substrate comprises the steps as follows: forming buried bitlines in the substrate, forming conductive, complementary bitline structures formed of doped polycrystalline silicon, the structures having lower surfaces formed on the buried bitlines in electrical contact therewith, and the complementary bitline structures having top surfaces and sidewalls, forming a polysilicon oxide of the doped polycrystalline silicon from the complementary bitline structures over the top surfaces thereof, forming tunneling oxide, polysilicon oxide sidewall layers adjacent to the complementary bitline structures and forming a tunnel oxide layer over the substrate between the complementary bitline structures, forming floating gates over the tunnel oxide layer and between the sidewall layers, forming an interconductor dielectric layer over the device, and forming an array of wordlines over the interconductor dielectric layer. Preferably, the complementary bitline structures comprise doped polycrystalline silicon conductive structures above the buried bitlines, having a thickness within a range between about 1000 Å and about 3000 Å provided by means of an etch back process. The floating gates have a thickness within a range from 1000 Å to 3000 Å and the tunneling oxide, polysilicon oxide sidewall layers comprise textured polysilicon oxide. Oxidizing of the sidewalls provides those polysilicon oxide sidewall layers which have a relatively high thickness between about 300 Å and about 600 Å. Over the complementary bitline structures is a polysilicon oxide film having a thickness between about 1000 Å and about 1500 Å.

In accordance with another aspect of this invention, a method of fabricating an MOSFET device on a lightly doped semiconductor substrate comprises forming a first dielectric layer on the substrate, forming a patterning layer over the dielectric layer, patterning the patterning layer by forming a mask with a pattern over the patterning layer. The pattern in the mask is etched into the patterning layer. Dopant is ion implanted into buried N+ source/drain regions in the substrate through the mask, forming a blanket deposit of a doped polysilicon 1 layer over the device, followed by planarizing the polysilicon 1 layer down to the level of the patterning layer exposing the surface of the polysilicon 1 layer which in the process of planarization has been formed into a bitline layer. A first polysilicon oxide layer is formed on the exposed surface of the polysilicon 1 layer, followed by stripping the remainder of the patterning layer, and then by etching away the remainder of the first dielectric layer down to the surface of the substrate. Oxidizing the sidewalls of the polysilicon 1 bitline layer layer and to form a tunneling oxide, polysilicon oxide sidewall layer from the polysilicon 1 layer follows. Oxidizing the exposed surface of the substrate to form a tunnel oxide layer thereon is performed contemporaneously. A blanket deposit of a doped polysilicon 2 layer is formed over the device followed by planarizing the polysilicon 2 layer down to the level of the first polysilicon oxide over the surface of the polysilicon 1 layer to form floating gate structures from the polysilicon 2 layer. A blanket ONO layer is formed over the device, followed by forming a conductor layer over the ONO layer, forming a blanket third polysilicon layer over the device, forming a control gate mask on the device, patterning the third polysilicon layer by etching portions of the third polysilicon layer unprotected by the control gate mask, and removal of the control gate mask. Preferably, the sidewalls of the polysilicon 1 are oxidized to provide a tunneling oxide, polysilicon oxide, sidewall layer have a thickness between about 300 Å and about 600 Å. Preferably, the patterning layer comprises silicon nitride. The silicon nitride has a thickness within a range from 1000 Å to 3000 Å. The second polysilicon layer has a thickness also within a range from 1000 Å to 3000 Å, and it is deposited after an etch back process. Oxidizing the sidewalls of the polysilicon 1 provides a textured, polysilicon oxide sidewall layer having a thickness between about 300 Å and about 600 Å. Oxidizing the the surface of the polysilicon 1 layer provides a polysilicon oxide film having a thickness between about 1000 Å and about 1500 Å.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

This invention provides a structure for a high-density, flash EEPROM memory device and a process sequence for producing such a high-density, flash EEPROM memory device.

Figure 1A:
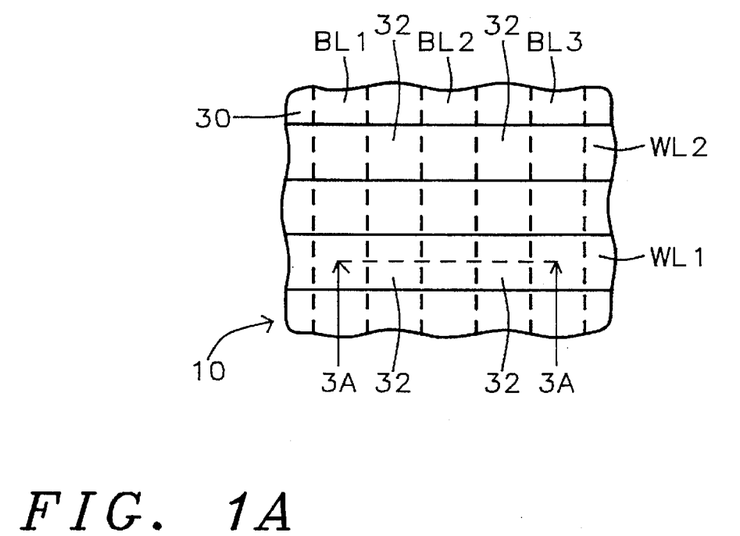
FIGS. 1A and 1B show a flash EEPROM device 10 in accordance with this invention.
Figure 1B:
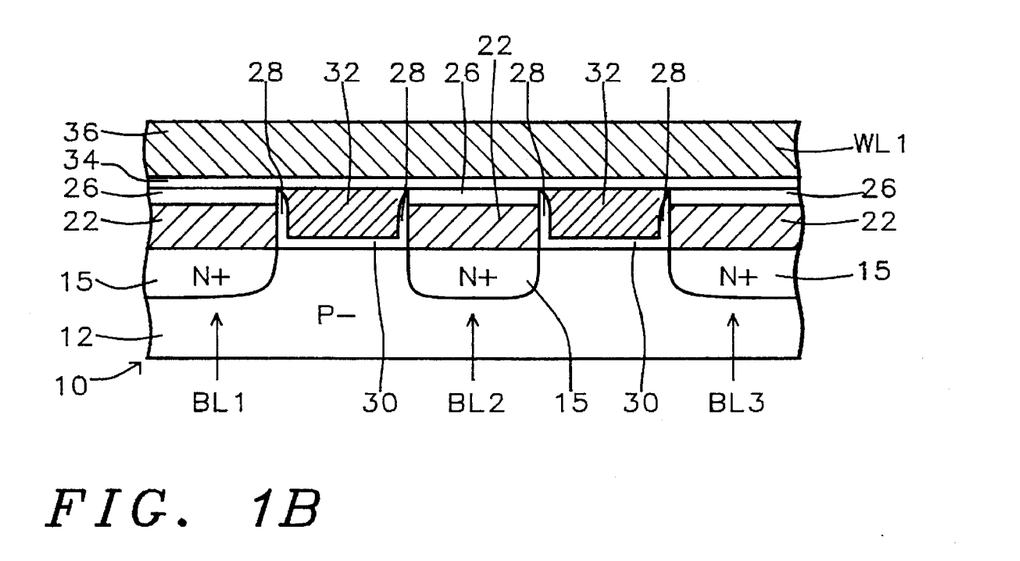

Referring to FIGS. 1A and 1B, a flash EEPROM device 10 in accordance with this invention is shown. FIG. 1A is a plan view of a fragment of device 10. FIG. 1B is a section taken along line 3A—3A in FIG. 1A. In accordance with this invention, device 20 includes substrate 12 with bitlines BL1, BL2 and BL3 which are formed of a combination of buried bitline regions 15 in P– substrate 12 and polysilicon 1 structures 22.

In particular, device 10 includes a P– substrate 12 with an array of buried bitlines regions 15 formed in the surface of substrate 11 forming the lower portions of bitlines BL1, BL2 and BL3. Above the surface of substrate 12 of a compound structure polysilicon 1 structures 22 are shorted to the buried N+ regions 15.

The top surface of polysilicon 1 layer 22 has been oxidized forming a polysilicon oxide 26 within a range of thicknesses between about 1,000 Å and about 1500 Å.

Polysilicon oxide (tunneling oxide) sidewalls 28 have been formed on the sides of polysilicon 1 structures 22 by oxidation thereof to form polysilicon oxide (polyoxide) sidewall layers 28 within a range of thicknesses (far thicker than the tunnel oxide of 60 Å to 120 Å for conventional flash EEPROM cells) between about 300 Å and about 600 Å. The polysilicon oxide sidewall layers 28 serve as a portion of the tunneling oxide of semiconductor devices formed in accordance with this invention. The combination of (tunneling oxide) sidewall layers 28 plus tunnel oxide layers 30 serve as the tunnel oxide 28 for the floating gates 32 of the devices of this invention. This polysilicon oxide layer 28 is suitable for the floating gate tunnel oxide because it is textured and efficient for tunneling, as well as, being thick enough for charge retention. Polysilicon oxide sidewall layers 28, which are thicker than the conventional tunnel oxide of 60 Å to 120 Å, give a highly reliable and highly efficient tunnel oxide due to the textured nature of polysilicon oxide. The polysilicon oxide sidewall layers 28 are thin enough for tunneling. The fact that they are also thick enough for charge retention, is a substantial advantage of this invention.

The program and erase operations of the memory cell can be accomplished by Fowler-Nordheim (F-N) tunnelling through polysilicon 1 sidewall oxide between the floating gate (polysilicon 2) and polysilicon 1 bitlines which are shorted to the source/drain (bitlines) of the device.

Simultaneously, with the formation of polysilicon oxide sidewall layers 28, the exposed surfaces of P-substrate 12 are oxidized forming silicon dioxide tunnel oxide layer 30 having a thickness of between about 150 Å and about 300 Å. The tunnel oxide layer 30 are formed between the upper portions of bitlines BL1, BL2 and BL3, i.e. polysilicon 1 structures 22.

A number of polysilicon 2 structures providing floating gates 32 are formed between the polysilicon oxide sidewall layers 28 and polysilicon 1 structures 22 (bitlines BL1, BL2 and BL3) above the tunnel oxide layer 30. The floating gates 32 are covered with a conventional ONO dielectric layer 34.

Above the ONO dielectric layer are wordlines (control gates) WL1 and WL2 which have been formed from a polysilicon 3 control gate layer 36.

FIGS. 3A–3L illustrate the process flow for manufacture a device in accordance with the invention.

Figure 3A:
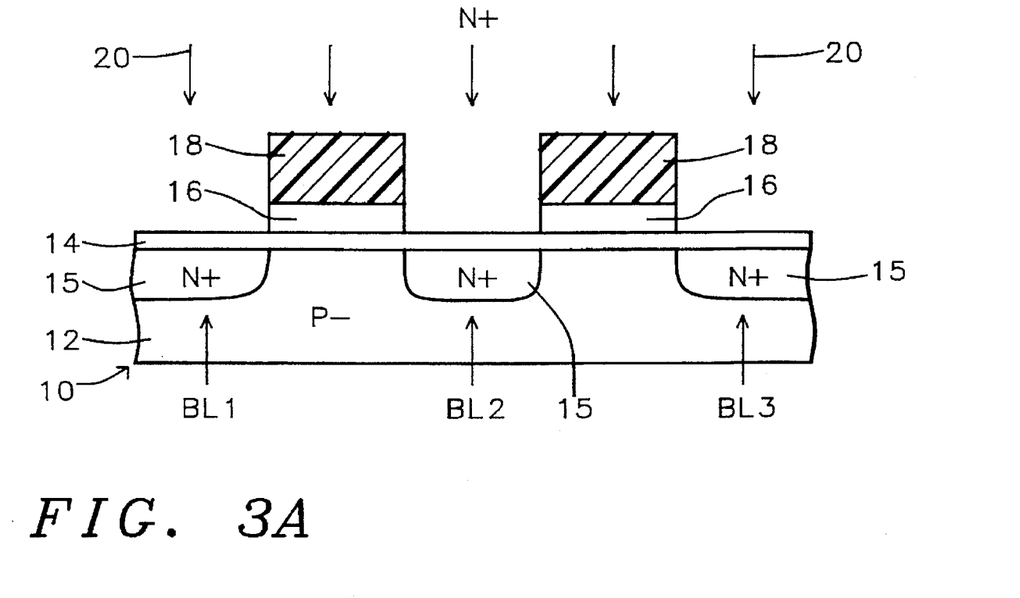
FIGS. 3A–3L illustrate the process flow for manufacture a device in accordance with the invention.

FIG. 3A shows a cross-sectional view taken along line 3A—3A in FIG. 1A of a fragment of a device 20 made in accordance with this invention in the early stages of manufacture in accordance with the method of this invention. In particular, a P– doped silicon substrate 20 is produced starting with the front end process.

By the conventional process of oxidation the substrate 20 is covered with a blanket of a first dielectric, silicon dioxide layer 14 having a preferred thickness of about 200 Å (within a range between about 0 Å and about 500 Å) in accordance with conventional a process, well known by those skilled in the art, such as growing silicon dioxide by thermal oxidation in dry $O_2$ and $N_2$ (e.g. 850° C. for 20 minutes.)

Figure 3B:
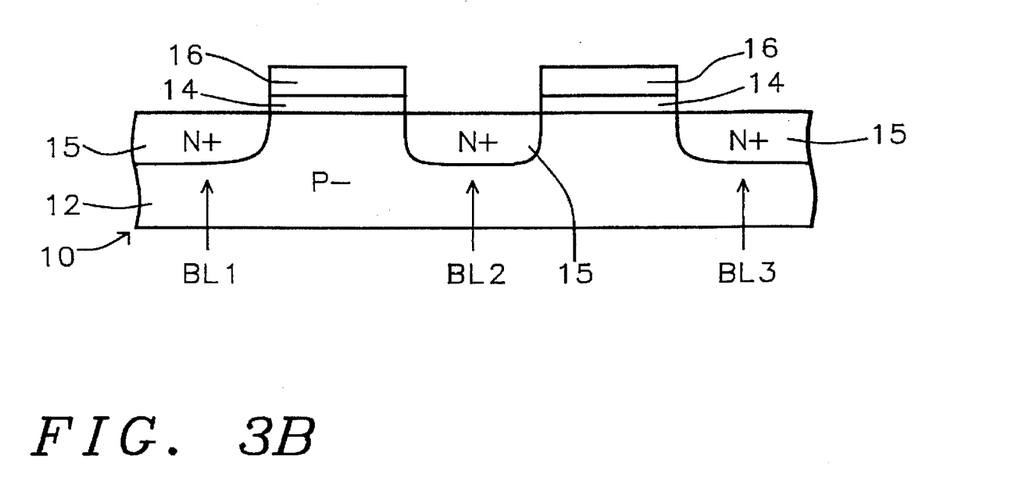
Figure 3C:
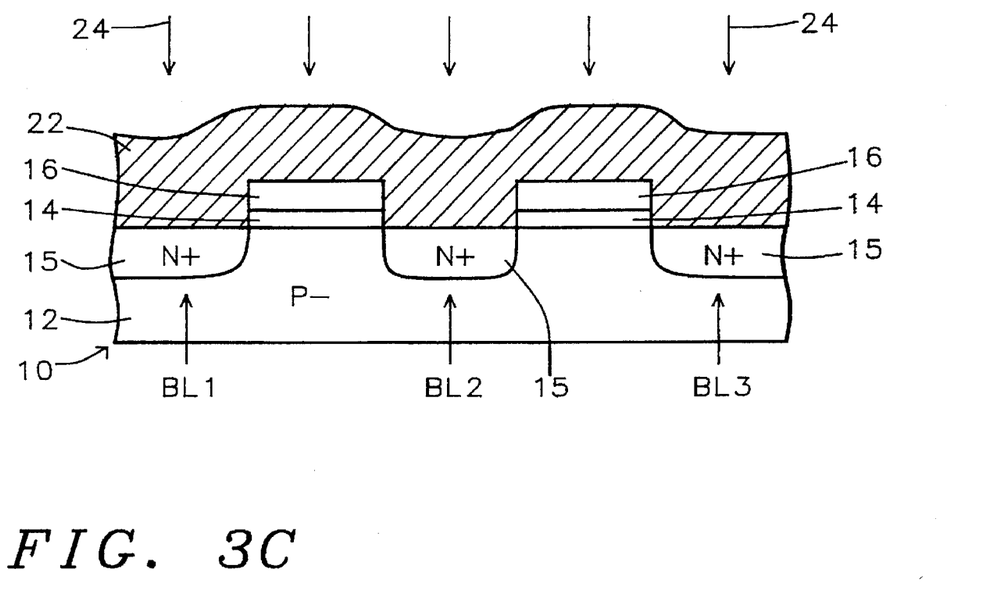

Referring again to FIG. 3A deposition of silicon nitride patterning layer 16 is performed. The blanket silicon nitride ($Si_3N_4$) patterning layer 16 is deposited to a thickness between about 1000 Å and about 3,000 Å by a conventional process. The silicon nitride layer 16 will be patterned as shown in FIG. 3B and used as shown in FIG. 3C to control the formation of layer 22, in FIG. 3D to control the planarization of polysilicon 1 layer 22, which are described below.

Then a buried N+ bitline, bitline S/D mask 18 is formed. Mask 18 is a conventional photoresist bitline source/drain S/D mask 18 with a conventional pattern of openings therein is formed over a portion of the silicon nitride layer 16 and a portion of the silicon dioxide layer 14 with a pattern for formation of buried bitlines 15 (BL1, BL2, and BL3.)

Next follows etching of silicon nitride layer 16, using mask 18 the silicon nitride layer 16 is etched through a pattern of openings in mask 18 down to silicon dioxide layer 14, using the mask 18 by conventional plasma etching with a $Cl_2$ or $F_2$ based etchant or by conventional wet etching with phosphoric acid ($H_3PO_4$).

Then a buried N+ bitline, S/D ion implant follows. In this case an N+ bitline dopant 20 is implanted into regions 15 below all of the exposed surface of the P-substrate 12. The implantation of those As ions 20 is performed preferably with an energy of about 50 keV. A range of energies between about 20 keV and about 100 keV is possible. The dose of As ions 20 is preferably $2 \times 10^{15}/cm^2$. A range of doses of As ions 20 between about $1 \times 10^{15}/cm^2$ and about $8 \times 10^{15}/cm^2$ is possible.

A gate oxide etch and resist strip step follows. Referring to FIG. 3B, the product of FIG. 3A is shown after the ion implantation of dopant 20 into N+ bitline regions 15 and after the portions of the silicon dioxide layer 14 exposed through mask 18 are etched away by a wet etching process using an aqueous solution of HF or by use of a dry etching process.

The photoresist mask 18 is then stripped from the device exposing the surface of the remaining portions of silicon nitride layer 16, which was provided for the purpose of patterning the polysilicon 1 layer which is to be formed next as will be explained below.

Next, a process of deposition of polysilicon 1 and doping is described. Referring to FIG. 3C, the product of FIG. 3B is shown after a blanket layer of polysilicon 1 layer 22 is deposited to a preferred range of thicknesses between about 1,500 Å and about 6,000 Å by the conventional LPCVD (low pressure chemical vapor deposition) process.

Then, polysilicon 1 layer 22 is doped in situ or in a blanket application of dopant of phosphoryl chloride ($POCl_3$) at a temperature between about 850° C. and about 950° C. for between about 5 and about 30 minutes or by ion implantation with ions 24. In the case of ion implantation, the arsenic or phosphorus dopant 24 is applied with a dose within a range between about $1 \times 1014/cm^2$ and about $1 \times 1016/cm^2$ within a range of energies between about 20 keV and about 100 keV.

Figure 3D:
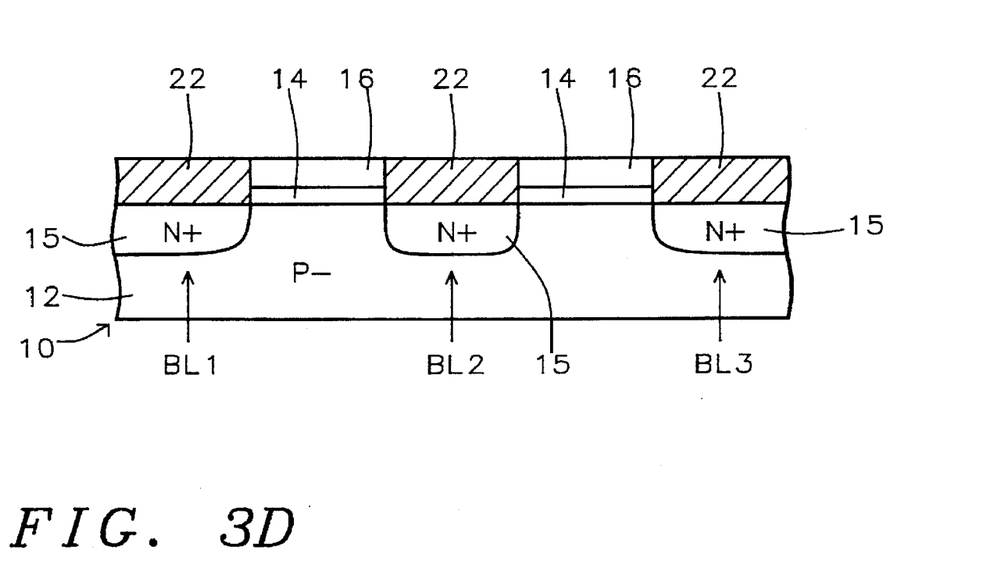

Next follows polysilicon 1 planarization. Referring to FIG. 3D, the product of FIG. 3C is shown after the polysilicon 1 layer 22 is planarized by means of an etch back with a conventional planarization process such as plasma etching in an $F_2$ ambient or by a CMP (Chemical Mechanical Polishing) process.

The etch back process stops when the etching reaches an etch stop at the silicon nitride layer 14, providing a substantially flat planar surface of polysilicon 1 layer 22 and silicon nitride 22. Planarization does not etch away much of silicon nitride layer 16; and therefore the thickness of the resulting polysilicon 1 layer 22 is between about 1000 Å and about 3000 Å in view of the fact that the thickness of the layer 14 and the layer 16 are equivalent to the thickness of layer 22 after planarization.

Note that the polysilicon 1 layer 22 and the N+ buried bitline regions 15 (BL1, BL2 and BL3) are shorted together to form a set of compound (buried N+ region 15 and above substrate polysilicon 1 layer 22) bitlines formed of the two elements in combination to provide substantially lower bitline resistance because of the increased cross sectional area of the bitlines.

Figure 3E:
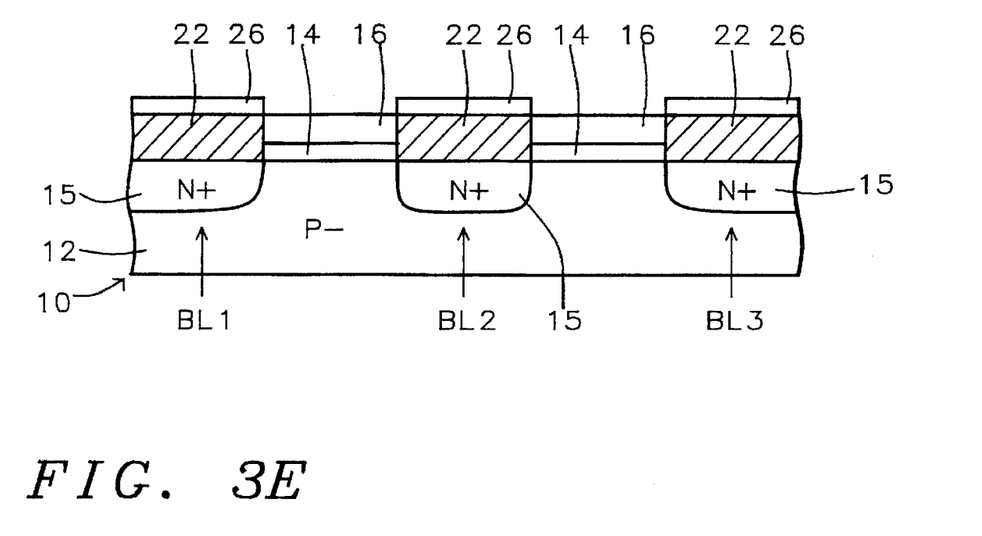

Polysilicon 1 oxidation follows. Referring to FIG. 3E, the product of FIG. 3D is shown after the top surface of polysilicon 1 layer 22 has been oxidized forming a top-side polysilicon oxide (polyoxide) layer 26 which is a material known by those skilled in the art. Polysilicon oxide top-side layer 26 has a preferred range of thicknesses between about 1,000 Å and about 1500 Å by the process of thermal oxidation at a temperature above about 850° C., in an oxygen/nitrogen gas ($O_2/N_2$) mixture atmosphere. The silicon nitride layer 16, which has remained, until this step in the process has been completed, prevents oxidation except for polysilicon oxide layer 26 on the top surface of polysilicon 1 layer 22.

Figure 3F:
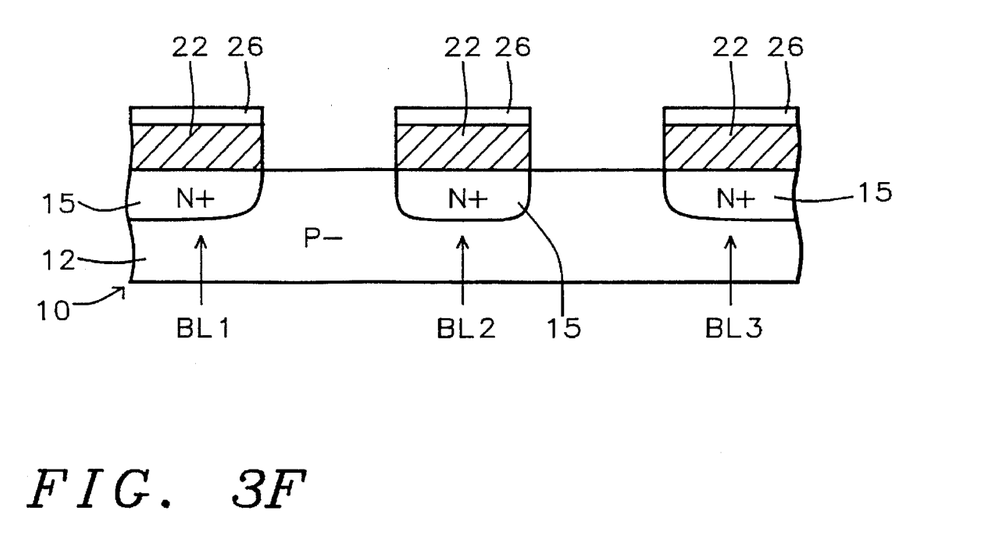

Etching of silicon nitride and silicon dioxide follows. Referring to FIG. 3F, the product of FIG. 3E is shown after the etching away of the remaining silicon nitride (isolating) layer 16. The silicon nitride layer 16 is stripped by phosphoric acid ($H_3PO_4$) in a wet etch. This etching has very little effect on the polysilicon oxide layer 26.

Next, the remainder of the silicon dioxide layer 14 (all of which is now exposed) is etched away by a wet etching process using an aqueous solution of HF or by use of a dry etching process.

Figure 3G:
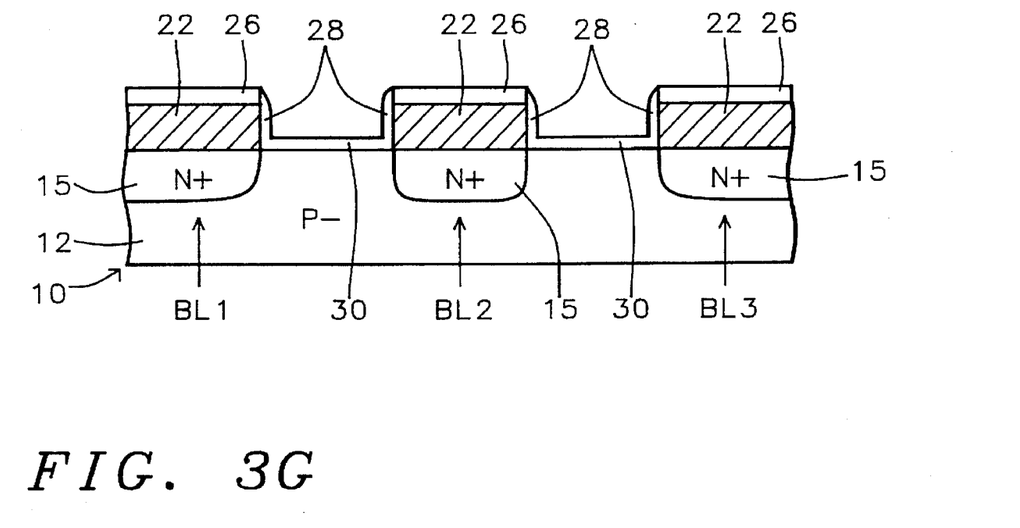

Polysilicon 1 sidewall oxidation and tunnel oxidation follows. Referring to FIG. 3G, the product of FIG. 3F is shown after the sidewalls of polysilicon 1 layer 22 have been oxidized to form polysilicon oxide (tunnelling oxide) sidewall layers 28. Simultaneously, the exposed surfaces of P-substrate 12 have been oxidized to form silicon dioxide tunnel oxide layer 30. The polysilicon oxide sidewall layers 28 have a range of thicknesses between about 300 Å and about 600 Å. The polysilicon oxide sidewall layers 28 serve as a part of the tunneling oxide of semiconductor devices formed by this method. The sidewall layers 28 combined with the tunnel oxide layer 30 serve as the tunnel oxide 28 for floating gates 32 (seen in FIGS. 1B and 3I–3L) of the devices 10 of this invention. This polysilicon oxide layer 28 is suitable for the (tunnel oxide) sidewall layer 28 for floating gates because it is textured and efficient for tunneling as well as being thick enough for charge retention. Tunnel oxide layer 30 has a thickness of between about 150 Å and about 300 Å. The preferred oxidation process comprises thermal oxidation at a temperature above about 850° C., in an $O_2/N_2$ mixture atmosphere for sufficient time to get the needed thicknesses.

Figure 3H:
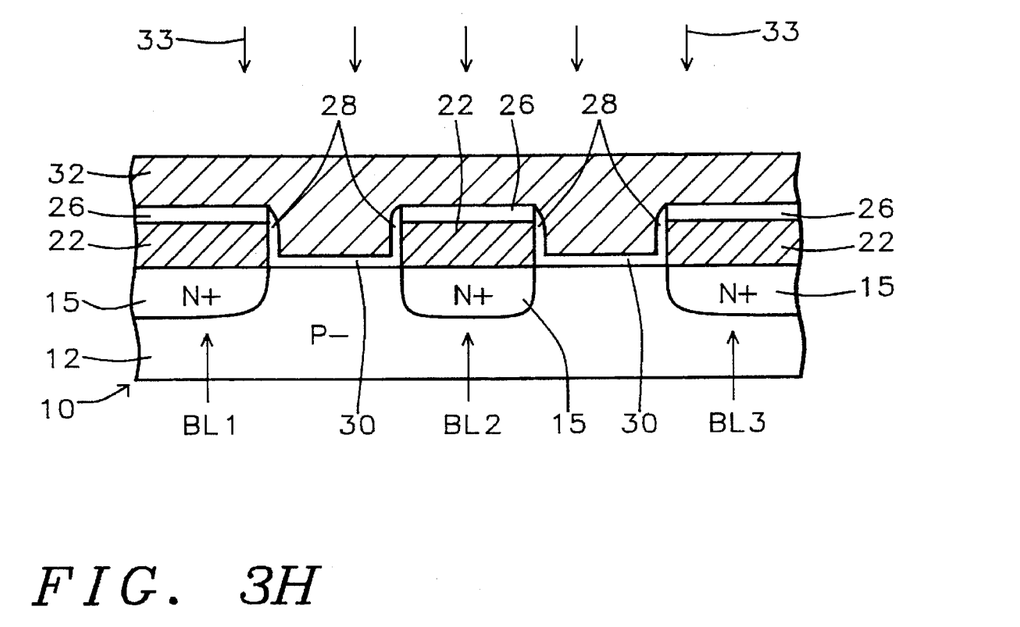

Polysilicon 2 deposition and doping follows. Referring to FIG. 3H, the product of FIG. 3G is shown after a polysilicon 2 layer 32 is deposited to a preferred range of thicknesses between about 3,000 Å and about 6,000 Å by the conventional LPCVD (low pressure chemical vapor deposition) process.

Polysilicon 2 layer 32 is doped in situ or with a blanket of dopant of phosphoryl chloride (POCl$_3$) at 900° C. for 20 minutes or by ion implantation with ions 33. In the case of ion implantation, the arsenic or phosphorus dopant 33 is applied with a dose within a range between about $1\times10^{14}$/cm$^2$ and about $1\times10^{16}$/cm$^2$ within a range of energies between about 20 keV and about 100 keV.

Figure 3I:
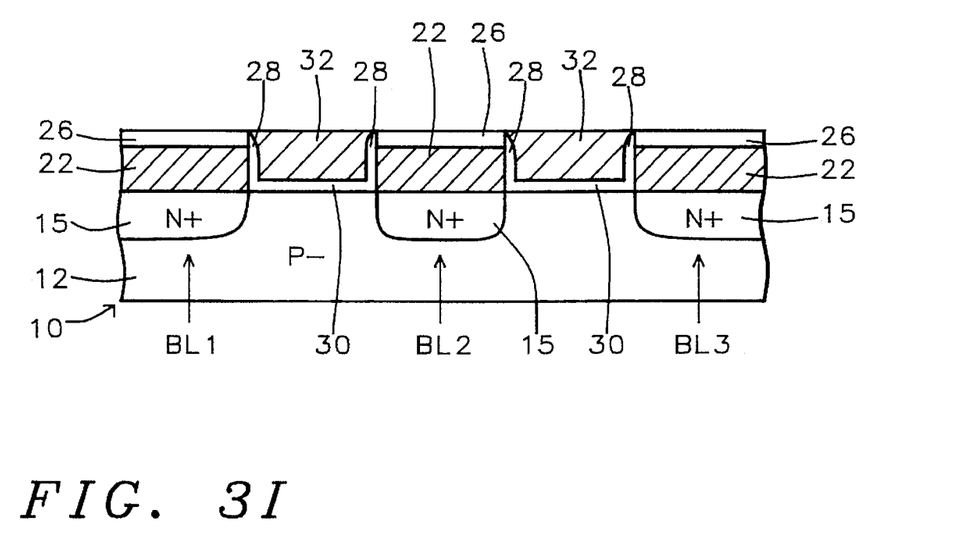

Polysilicon 2 planarization follows. Referring to FIG. 3I, the product of FIG. 3H is shown after the polysilicon 2 layer 32 is planarized by means of an etch back with a conventional planarization process or a CMP (Chemical Mechanical Polishing) process. The thickness of the resulting polysilicon 2 layer 32 is between about 1000 Å and about 3000 Å. The planarization process stops when the etching reaches the the level of the polysilicon oxide layer 26 over the surface of said polysilicon 1 layer 22 providing a substantially flat planar surface. The top polysilicon oxide layer 26 is needed to be thick first to serve as an etch stop and (2) to be sufficient as an insulator between the wordlines and the bitlines to reduce coupling in the devices finally produced by the process of this invention.

The planarized layer 32 leaves behind an array of floating gates 32 such as those shown in FIG. 1 between the bitlines 15 BL1, BL2 and BL3 and will lie beneath wordlines WL1, and WL2 36 to be deposited later.

Figure 3J:
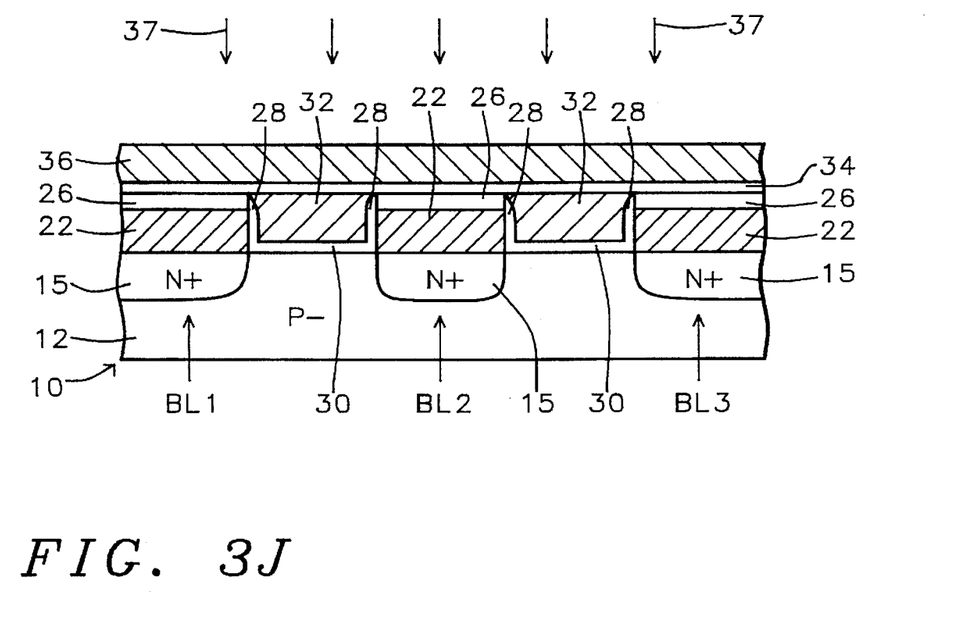
Figure 3K:
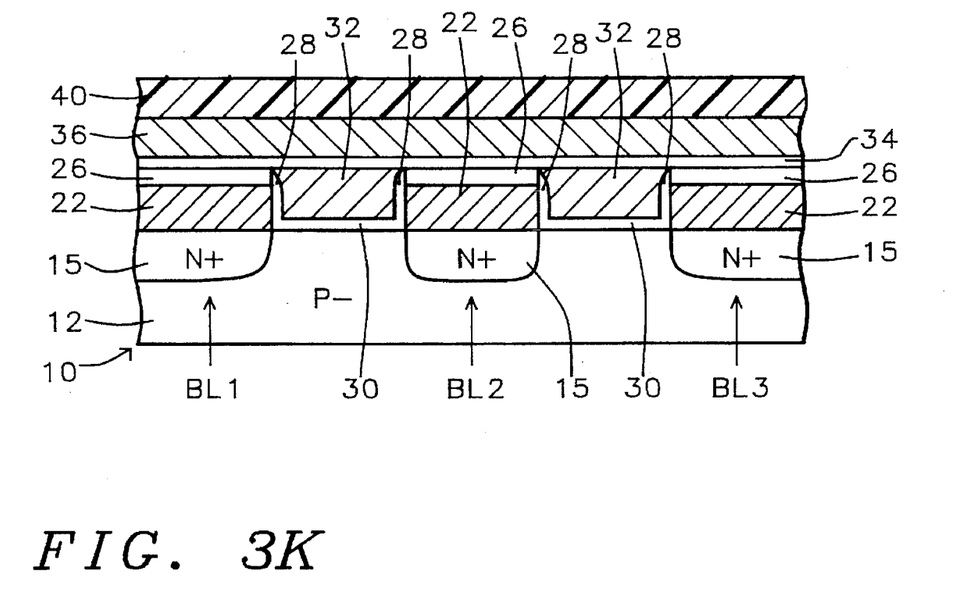
Figure 3L:
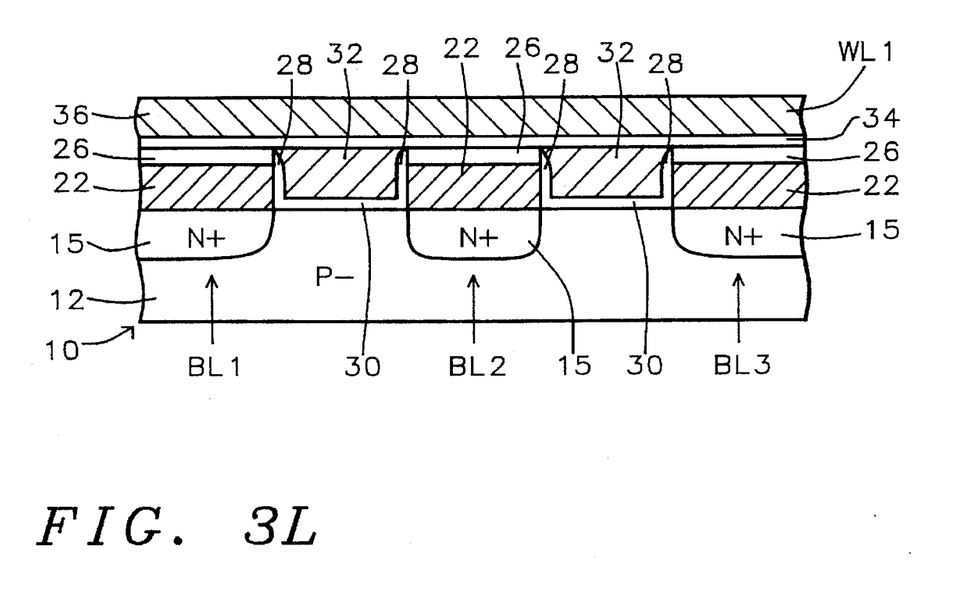

Interpolysilicon dielectric (ONO) is then formed over the layers below. Referring to FIG. 3J, the product of FIG. 3I is shown after the formation of interpolysilicon sandwich of dielectric 34, preferably ONO (Silicon Oxide:Silicon Nitride:Silicon Oxide) with an effective thickness of ONO, preferably of between about 100 Å to about 300 Å is applied to the exposed surfaces of the device of FIG. 3I by means of a conventional process.

Formation of polysilicon 3 layer 36 follows. Next, referring to FIG. 3J, again, a polysilicon 3 wordline layer 36, to be patterned into wordlines (control gates), is deposited within a range of thickness between about 2,000 Å and about 4,000 Å by the conventional LPCVD (low pressure chemical vapor deposition) process.

Polysilicon 3 layer 36 is doped in situ or with a blanket application of dopant from diffusion of phosphoryl chloride (POCl$_3$) at 900° C. for 20 minutes or by ion implantation with ions 37. In the case of ion implantation, the arsenic or phosphorus dopant 37 is applied with a dose within a range between about $1\times10^{14}$/cm$^2$ and about $1\times10^{16}$/cm$^2$ within a range of energies between about 20 keV and about 100 keV.

Next, control gate (wordline) masking and etching is performed. First, a mask layer 40 is formed over polysilicon 3 layer 36. Mask 40 is patterned in the form of wordlines WL1, WL2, etc. Then the polysilicon 3 layer 36 is etched accordingly using a conventional etchant using the mask 40 for patterning the polysilicon 3 layer 36 producing wordlines wordline WL1 and WL2, as shown in FIGS. 1A and 1B formed in accordance with the conventional design.

Back End Process

Conventional back end process steps follow including deposition of a glass (BPSG) layer, flow, contact formation, metallization and passivation.

SUMMARY

By using the process of this invention, polysilicon 1 layer 16 and buried N+ regions 15 form the lower resistance bitlines BL1, BL2 and BL3. More importantly, the sidewall polysilicon oxide sidewall layers 28 which are thicker than used in conventional Flash EEPROM cells (tunnel oxide of about 60 Å to 120 Å) will give a highly reliable, and highly efficient tunnel oxide. The program and erase operations of the memory cell 10 can be accomplished by Fowler-Nordheim (F-N) tunnelling through polysilicon 1 sidewall oxide sidewall layers 28 between the floating gate 32 (polysilicon 2) and polysilicon 1 bitlines 22 which are shorted to the source/drain (bitlines) 15 of the device.

This invention provides an improved efficiency of the tunneling for programming and erase functions and provides low bitline resistance.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabricating a non-volatile memory device on a semiconductor substrate comprises:

forming buried bitlines in said substrate;

forming conductive, complementary bitline structures of doped polycrystalline silicon on said buried bitlines and in electrical contact therewith, said complementary bitline structures having top surfaces and sidewalls;

forming protective insulating layers on said top surfaces of said complementary bitline structures;

forming tunneling oxide sidewall layers adjacent to said complementary bitline structures and forming a tunnel oxide layer over said substrate between said complementary bitline structures;

depositing a floating gate polysilicon layer over said protective insulating layers, said tunneling oxide sidewall layers and said tunnel oxide layer;

removing portions of said floating gate polysilicon layer to define floating gates having top surfaces level with upper surfaces of said protective insulating layer;

forming an interconductor dielectric layer over said device; and forming an array of wordlines over said interconductor dielectric layer.

2. A method in accordance with claim 1 wherein said top surfaces of said complementary bitline structures have a thickness within a range between about 1000 Å and about 3000 Å are defined by means of an etch back process.

3. A method in accordance with claim 1 wherein said complementary bitline structures have a thickness between about 1000 Å and about 3000 Å.

4. A method in accordance with claim 3 wherein said floating gates have a thickness within a range from 1000 Å to 3000 Å.

5. A method in accordance with claim 4 wherein said tunneling oxide and tunneling oxide sidewall layers comprise polysilicon oxide.

6. A method in accordance with claim 1 wherein said step of removing includes a chemical mechanical polishing process.

7. A method in accordance with claim 1 wherein said tunneling oxide sidewall layers have a thickness between about 300 Å and about 600 Å.

8. A method in accordance with claim 1 wherein said protective insulating layers on said complementary bitlines are polysilicon oxide having a thickness between about 1000 Å and about 1500 Å.

9. A method in accordance with claim 4 wherein said tunneling oxide and tunneling oxide sidewall layers have a thickness between about 300 Å and about 600 Å.

10. A method in accordance with claim 8 wherein said step of forming tunneling oxide sidewall layers comprises oxidizing said sidewalls of said polycrystalline silicon conductors to form polysilicon oxide sidewall layers having a thickness between about 300 Å and about 600 Å.

11. A method of fabricating a non-volatile device on a lightly doped semiconductor substrate comprising:

forming a first dielectric layer on said substrate;

forming a patterning layer over said dielectric layer;

patterning said patterning layer by forming a mask with a pattern over said pattering layer and etching the pattern in said mask into said patterning layer;

ion implanting dopant into buried N+ source/drain regions in said substrate exposed by said mask;

forming a blanket doped polysilicon 1 layer over said device;

planarizing said polysilicon 1 layer down to said patterning layer, exposing the surface of said polysilicon 1 layer and forming a bitline layer;

forming a first polysilicon oxide layer on said exposed surface of said polysilicon 1 layer;

removing the remainder of said patterning layer after said patterning step;

etching away said first dielectric layer down to said substrate;

oxidizing sidewalls of said polysilicon 1 layer to form a tunneling oxide sidewall layer from said polysilicon 1 layer, and oxidizing the exposed surface of said substrate to form a tunnel oxide layer thereon;

forming a blanket doped polysilicon 2 layer over said device;

planarizing said polysilicon 2 layer down to said first polysilicon oxide over the surface of said polysilicon 1 layer to form floating gate structures from said polysilicon 2 layer;

forming a blanket dielectric layer over said floating gate device;

forming a blanket polysilicon 3 layer over said blanket dielectric layer;

forming a control gate mask on said device;

patterning said polysilicon 3 layer by etching portions of said polysilicon 3 layer unprotected by said control gate mask; and removing said control gate mask.

12. A method in accordance with claim 11 wherein oxidizing said sidewalls of said polysilicon 1 layer provides a tunneling oxide sidewall layer having a thickness between about 300 Å and about 600 Å.

13. A method in accordance with claim 12 wherein said patterning layer comprises silicon nitride.

14. A method in accordance with claim 13 wherein said silicon nitride has a thickness within a range from 1000 Å to 3000 Å.

15. A method in accordance with claim 14 wherein said polysilicon 2 layer has a thickness within a range from 1000 Å to 3000 Å after an etch back process.

16. A method in accordance with claim 11 wherein said patterning layer comprises silicon nitride.

17. A method in accordance with claim 16 wherein said silicon nitride has a thickness within a range from 1000 Å to 3000 Å.

18. A method in accordance with claim 17 wherein said polysilicon 2 layer has a thickness within a range from 1000 Å to 3000 Å.

19. A method in accordance with claim 12 wherein said tunnel oxide layer has a thickness between about 150 Å to 300 Å.

20. A method in accordance with claim 19 wherein said first polysilicon oxide layer has a thickness between 1000 Å and 1500 Å.

21. The method of claim 11, wherein said dielectric layer comprises ONO.

22. The method of claim 19, wherein said dielectric layer comprises ONO and has a thickness between about 100 Å to 300 Å.

* * * * *